(12) United States Patent
Kazue

(10) Patent No.: US 10,672,659 B2
(45) Date of Patent: Jun. 2, 2020

(54) ELECTRONIC COMPONENT MANUFACTURING METHOD

(71) Applicant: CANON KABUSHIKI KAISHA, Tokyo (JP)

(72) Inventor: Yuichi Kazue, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 149 days.

(21) Appl. No.: 15/904,166

(22) Filed: Feb. 23, 2018

(65) Prior Publication Data
US 2018/0247868 A1    Aug. 30, 2018

(30) Foreign Application Priority Data
Feb. 28, 2017 (JP) .................. 2017-037534

(51) Int. Cl.
*H01L 21/768* (2006.01)
*H01L 21/288* (2006.01)
(Continued)

(52) U.S. Cl.
CPC .... *H01L 21/76898* (2013.01); *H01L 21/2885* (2013.01); *H01L 21/28568* (2013.01); *H01L 21/32134* (2013.01); *H01L 21/32136* (2013.01); *H01L 21/76846* (2013.01); *H01L 21/76873* (2013.01); *H01L 21/78* (2013.01); *H01L 23/481* (2013.01); *H01L 24/94* (2013.01); *H01L 21/32139* (2013.01); *H01L 21/76852* (2013.01); *H01L 21/76885* (2013.01); *H01L 23/528* (2013.01); *H01L 23/53214* (2013.01); *H01L 23/53257* (2013.01); *H01L 24/13* (2013.01);
(Continued)

(58) Field of Classification Search
CPC ......... H01L 21/76898; H01L 21/28568; H01L 21/2885; H01L 21/32136; H01L 21/32134; H01L 21/76846; H01L 21/76873; H01L 21/73; H01L 21/32139; H01L 23/481; H01L 24/94
See application file for complete search history.

(56) References Cited

U.S. PATENT DOCUMENTS

| 5,529,956 A | 6/1996 | Morishita |
| 2005/0006783 A1* | 1/2005 | Takao ............... H01L 23/3114 257/774 |

(Continued)

FOREIGN PATENT DOCUMENTS

| JP | 5-29315 A | 2/1993 |
| JP | 2010-10557 A | 1/2010 |

(Continued)

*Primary Examiner* — Peniel M Gumedzoe
(74) *Attorney, Agent, or Firm* — Canon U.S.A. Inc., IP Division

(57) ABSTRACT

An electronic component manufacturing method includes preparing a structure including a conductive member, forming a seed metal layer including first and second portions electrically connected to the conductive member on a surface of the structure, forming a plating layer on the first portion of the seed metal layer in a state in which the second portion of the seed metal layer is covered by a first member, forming a conductive second member on the first portion of the seed metal layer via the plating layer, and etching the second portion of the seed metal layer in a state in which the plating layer is covered by the second member.

20 Claims, 6 Drawing Sheets

(51) Int. Cl.
    *H01L 21/3213*   (2006.01)
    *H01L 21/285*   (2006.01)
    *H01L 21/78*   (2006.01)
    *H01L 23/00*   (2006.01)
    *H01L 23/48*   (2006.01)
    *H01L 23/528*   (2006.01)
    *H01L 23/532*   (2006.01)

(52) U.S. Cl.
    CPC .............. *H01L 24/16* (2013.01); *H01L 24/81* (2013.01); *H01L 2224/13025* (2013.01); *H01L 2924/37001* (2013.01)

(56) References Cited

U.S. PATENT DOCUMENTS

| | | | |
|---|---|---|---|
| 2009/0284631 A1* | 11/2009 | Matsuo | H01L 23/481 348/294 |
| 2013/0313688 A1 | 11/2013 | Nomura | |
| 2014/0232011 A1 | 8/2014 | Tsumura | |
| 2014/0284772 A1 | 9/2014 | Ogiso et al. | |
| 2017/0194302 A1* | 7/2017 | Disney | H01L 33/62 |

FOREIGN PATENT DOCUMENTS

| | | |
|---|---|---|
| JP | 2010-80525 A | 4/2010 |
| JP | 2012-248671 A | 12/2012 |
| JP | 2013-247254 A | 12/2013 |
| JP | 2014-165204 A | 9/2014 |
| JP | 2014-183185 A | 9/2014 |
| JP | 2014-187297 A | 10/2014 |

\* cited by examiner

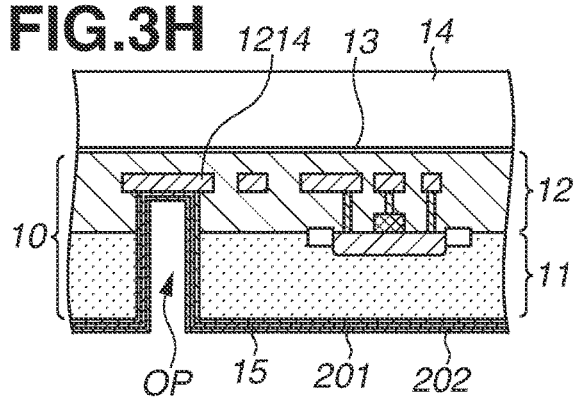
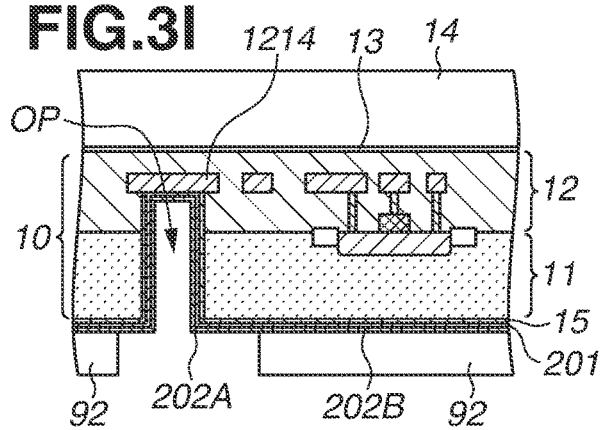
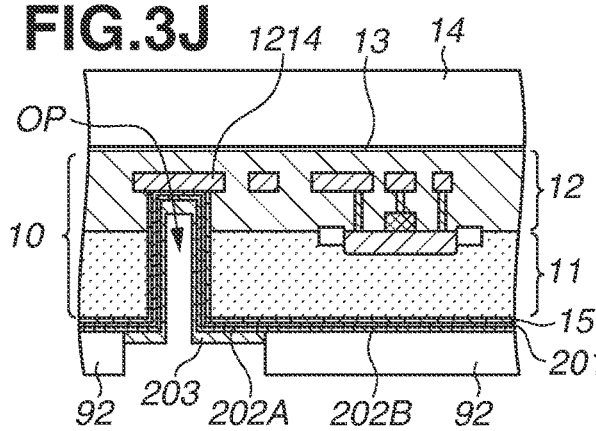
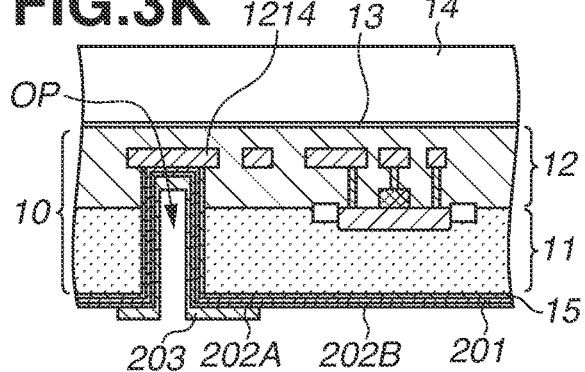
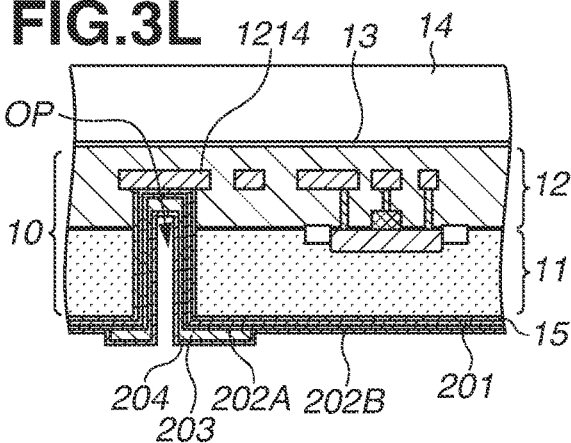
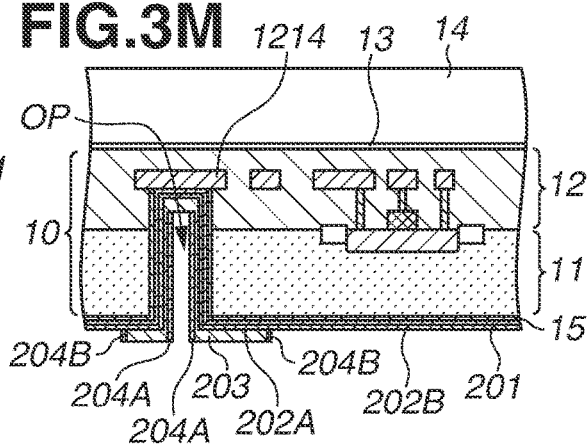
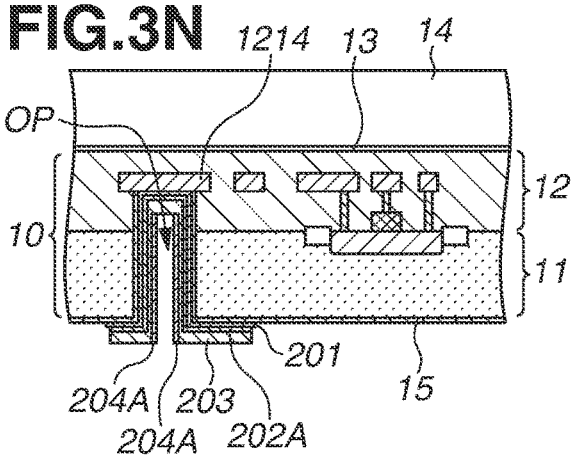

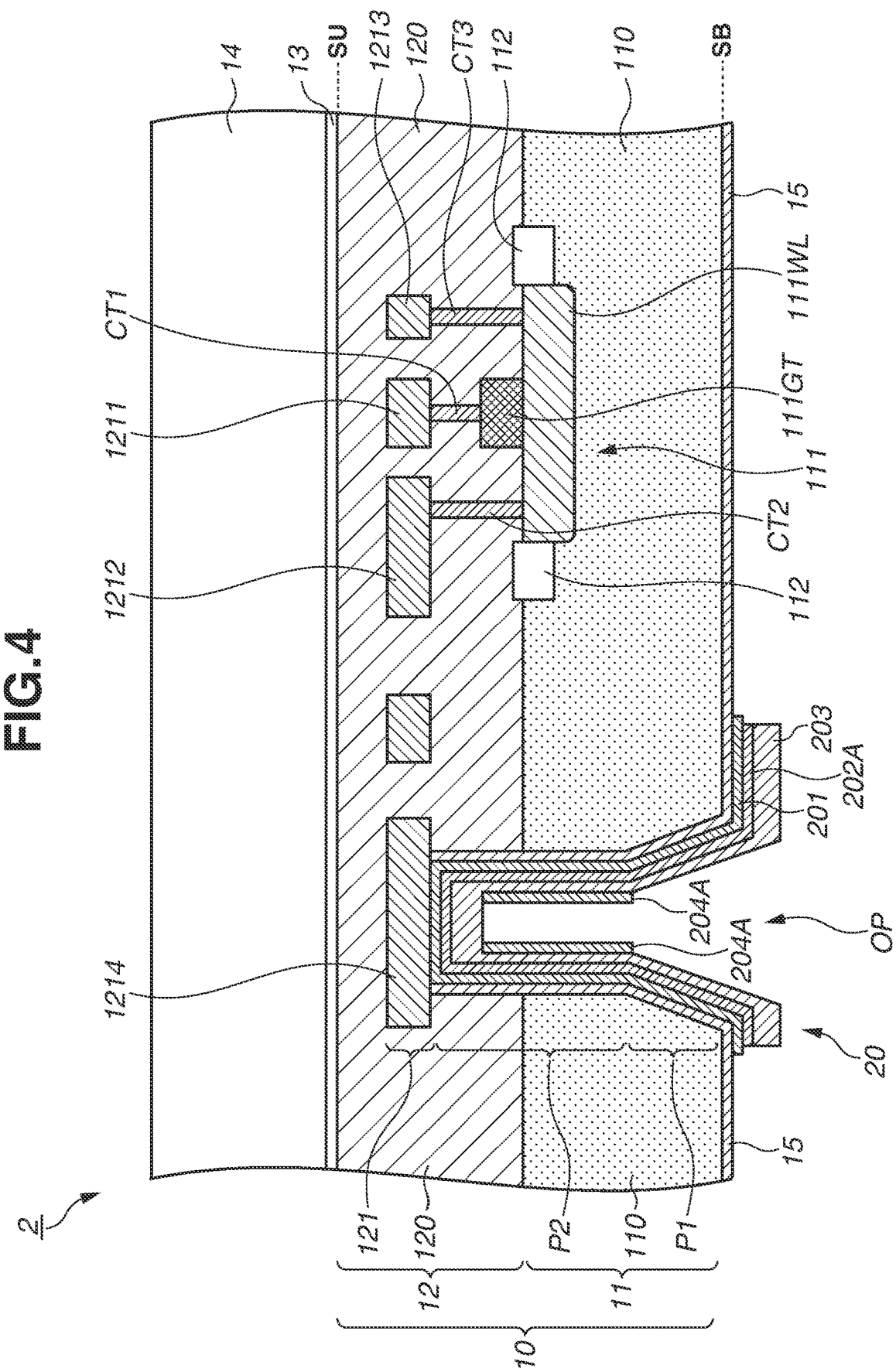

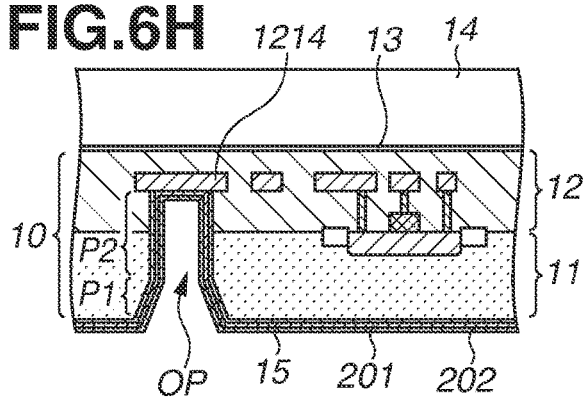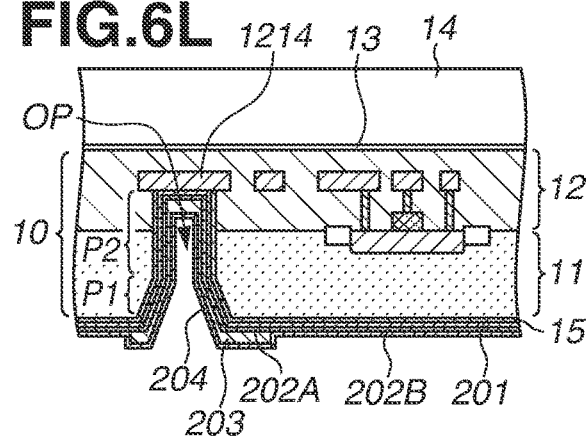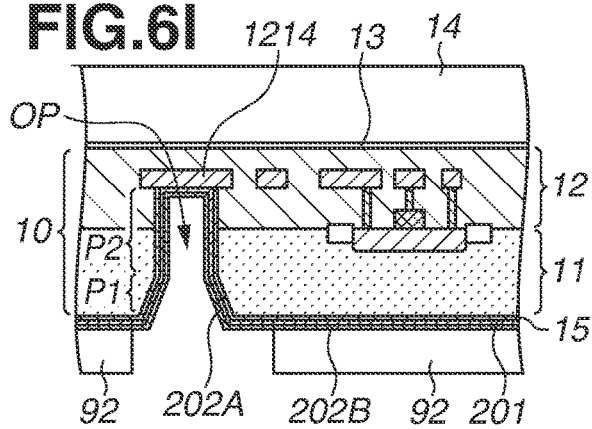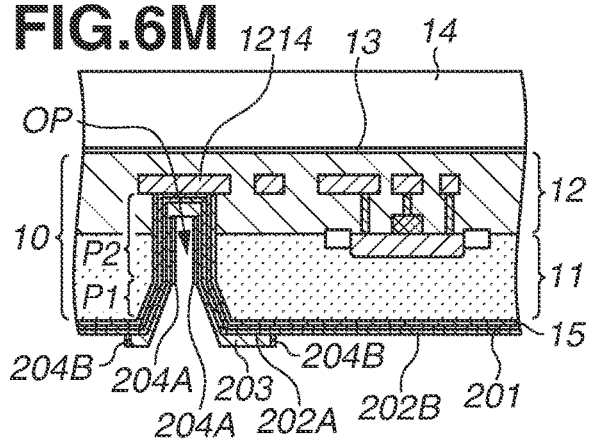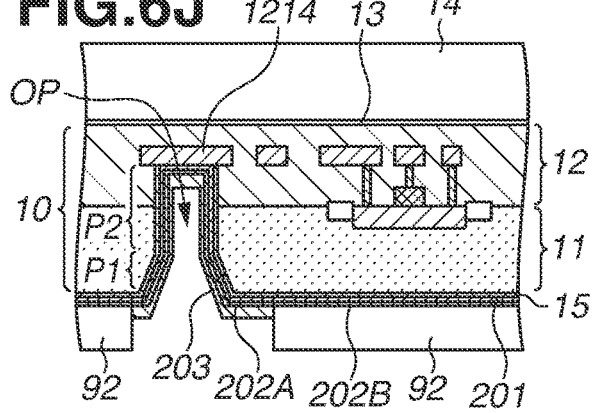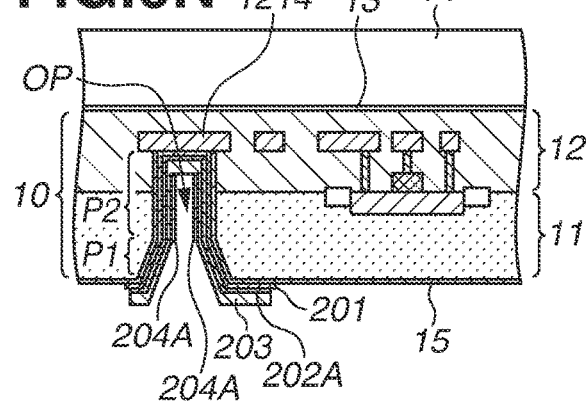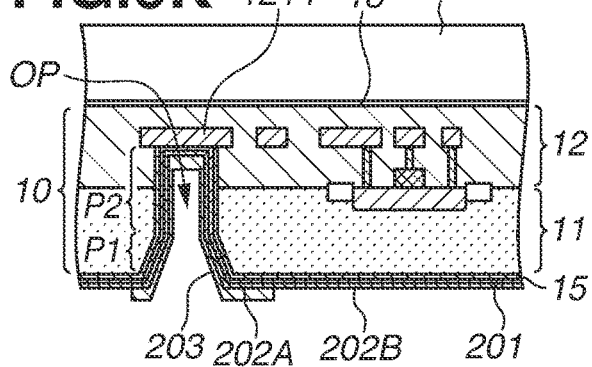

ELECTRONIC COMPONENT MANUFACTURING METHOD

BACKGROUND

Field of the Disclosure

The present disclosure generally relates to an electronic component manufacturing method.

Description of the Related Art

An electronic component includes a structure including a semiconductor substrate and a wiring structure and an electrode connected to a conductive member (a conductive pattern) inside the wiring structure (see Japanese Patent Application Laid-Open No. 2014-183185). This electrode is obtained by forming an opening in the structure in such a manner that the conductive member is exposed to the outside and forming a metal member in the opening. To appropriately form the electrode, a seed metal layer is formed in this opening, as a base layer of the metal member. The seed metal layer is formed by sputtering, etc. on a surface of the side of the structure in which the opening is formed (hereinafter, a surface in which the opening is formed). The unnecessary portion of the seed metal layer is removed by etching after the above metal member (a plating layer) is formed.

SUMMARY OF THE DISCLOSURE

Because of the above etching performed to remove the unnecessary portion of the seed metal layer, the metal member could be locally thinned or removed. Consequently, the resistance of the electrode could be increased or the electrode could be disconnected, resulting in deterioration in electrical characteristics of the electronic component or deterioration in the yield thereof.

The present disclosure is directed to provision of an advantageous technique that improves electrical characteristics of electronic components or the yield thereof.

According to an aspect of the present disclosure, an electronic component manufacturing method includes preparing a structure including a conductive member, forming a seed metal layer including first and second portions electrically connected to the conductive member on a surface of the structure, forming a plating layer on the first portion of the seed metal layer in a state in which the second portion of the seed metal layer is covered by a first member, forming a conductive second member on the first portion of the seed metal layer via the plating layer, and etching the second portion of the seed metal layer in a state in which the plating layer is covered by the second member.

Further features of the present disclosure will become apparent from the following description of exemplary embodiments with reference to the attached drawings.

BRIEF DESCRIPTION OF THE DRAWINGS

FIGS. 2A to 2G and FIGS. 3H to 3N illustrate an example of a method for manufacturing the electronic component.

FIG. 4 illustrates a configuration example of an electronic component according to a second exemplary embodiment.

FIGS. 5A to 5G and FIGS. 6H to 6N illustrate an example of a method for manufacturing the electronic component.

DESCRIPTION OF THE EMBODIMENTS

Figure 1:
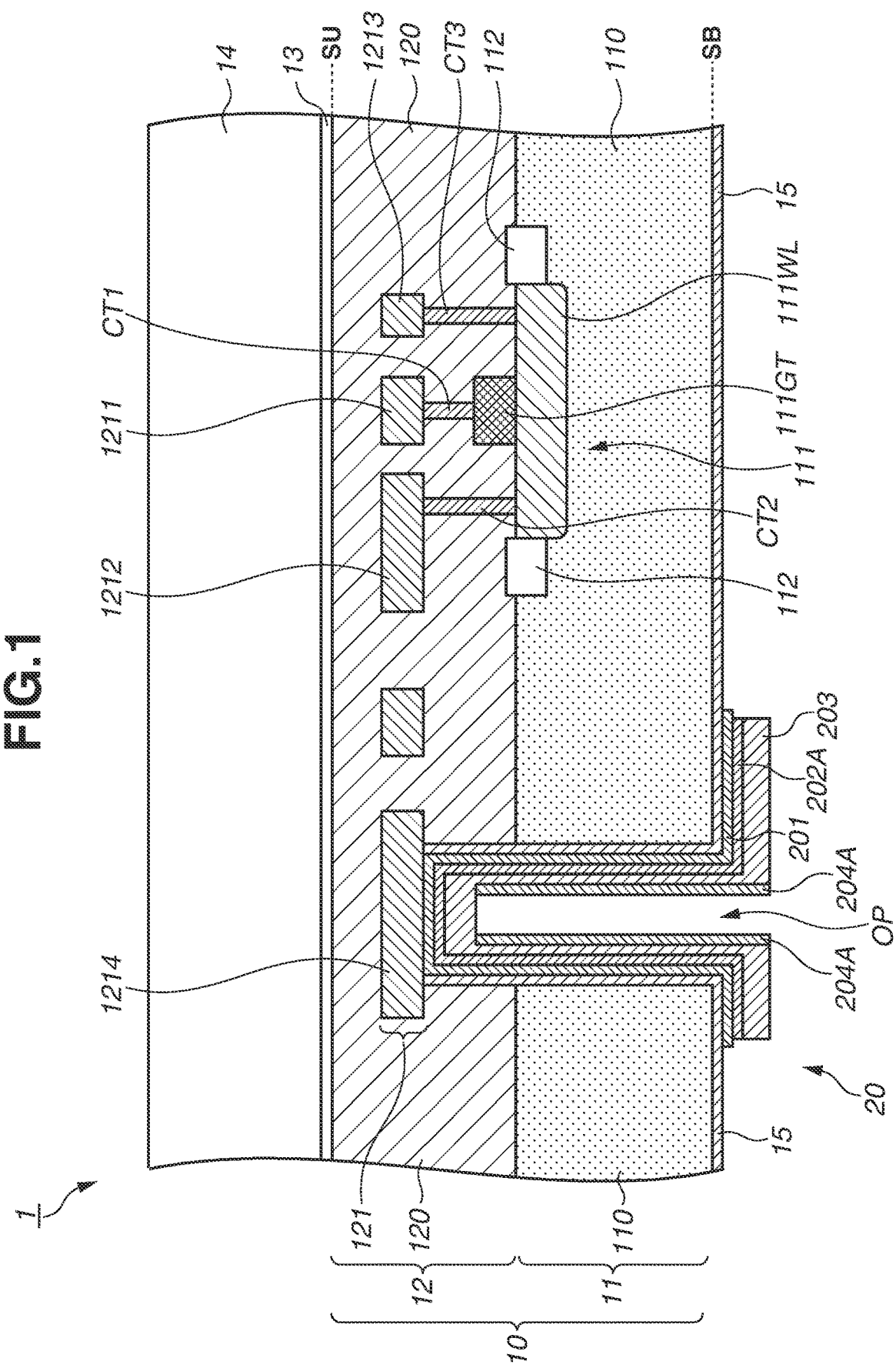
FIG. 1 illustrates a configuration example of an electronic component according to a first exemplary embodiment.

Hereinafter, suitable exemplary embodiments of the present disclosure will be described with reference to the attached drawings. The individual drawings have been provided only to describe structures or configurations, and the sizes of the illustrated individual members do not necessarily reflect the actual sizes thereof. In addition, in the drawings, the members or components having the same character are provided with the same reference number, and redundant description thereof will be avoided.

FIG. 1 schematically illustrates a configuration of an electronic component 1 according to a first exemplary embodiment. In the following description, there are cases in which expressions indicating directions, such as "above" and "below", are used. When such an expression is used for two members, it indicates relative positions of the two members.

The electronic component 1 is a semiconductor device in the present exemplary embodiment and includes a structure 10, a glass substrate 14 fixed to an upper surface SU of the structure 10 via an adhesive layer 13, and an electrode 20 formed in a bottom surface SB of the structure 10. The structure 10 includes a substrate 11 and a wiring structure 12 formed on the substrate 11. The substrate 11 includes a semiconductor substrate 110 and an element 111. While the semiconductor substrate 110 is a silicon substrate in the present exemplary embodiment, the semiconductor substrate 110 may be formed by using a different kind of semiconductor material such as gallium arsenide. The element 111 is formed in the semiconductor substrate 110. While FIG. 1 illustrates a single metal-oxide-semiconductor (MOS) transistor as the element 111, a plurality of elements 111 including other passive elements and active elements is formed in the semiconductor substrate 110.

The MOS transistor element 111 includes a well region 111WL and a gate electrode 111GT. The well region 111WL includes a drain region, a source region, and a channel region, which are not illustrated in FIG. 1. The gate electrode 111GT is formed above the well region 111WL via a gate insulating film (not illustrated). The element 111 is electrically separated from other elements by an element isolation portion 112 formed in the semiconductor substrate 110. In the present exemplary embodiment, while shallow trench isolation (STI) is used to form the element isolation portion 112, another technique may alternatively be used.

The wiring structure 12 includes an insulating member 120 and a wiring portion 121. The insulating member 120 is formed by laminating insulating layers such as silicon oxide, silicon nitride, and silicon oxynitride layers. The wiring portion 121 is included in the insulating member 120 and includes conductive members 1211 to 1214 in the present exemplary embodiment. The conductive member 1211 is electrically connected to the gate electrode 111GT via a contact plug CT1. The conductive members 1212 and 1213 are electrically connected to the drain and source regions of the well region 111WL via contact plugs CT2 and CT3, respectively. While the wiring structure 12 includes a single wiring layer in the present exemplary embodiment, the wiring structure 12 may have a multilayer wiring structure in which two or more wiring layers are used.

The electrode 20 is formed in an opening OP formed in the bottom surface SB of the structure 10 and is electrically connected to the conductive member 1214. An insulating protective film 15 is formed on the bottom surface SB of the structure 10 and on the side surface of the opening OP. This protective film 15 electrically isolates the electrode 20 from the semiconductor substrate 110. As will be described in more detail below, the electrode 20 includes a barrier metal layer 201, a seed metal layer 202A, a plating layer 203, and a protective film 204A in the present exemplary embodiment.

Figure 2A:
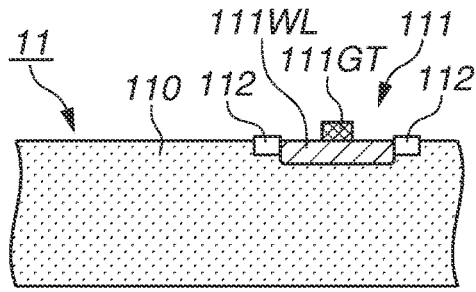
Figure 2B:
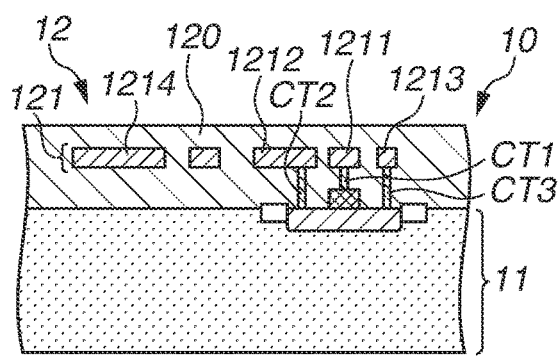

In a step in FIG. 2A, the substrate 11 is prepared. The substrate 11 can be obtained by forming the element 111 on the semiconductor substrate 110 by using a known semiconductor manufacturing process. Next, in a step in FIG. 2B, the wiring structure 12 is formed on the substrate 11 to acquire the structure 10. A borophosphosilicate glass (BPSG) film is formed by sub-atmospheric chemical vaper deposition (SACVD) as the insulating member 120 in the wiring structure 12 in the present exemplary embodiment. In addition, in the present exemplary embodiment, aluminum (Al) is used for the conductive members 1211 to 1214 of the wiring portion 121 in the wiring structure 12, and tungsten (W) is used for the contact plugs CT1 to CT3.

As another exemplary embodiment, a dual damascene method may be used to form the wiring portion 121. In this case, for example, the conductive member 1211 and the contact plug CT1 are integrally formed (the same holds true for the conductive member 1212 and the contact plug CT2 and for the conductive member 1213 and the contact plug CT3).

While the wiring structure 12 includes a single wiring layer in the present exemplary embodiment, the wiring structure 12 may have a multilayer wiring structure. In such case, the wiring structure 12 can be obtained, for example, by alternately forming an interlayer insulating layer and a wiring layer repeatedly.

Figure 2C:
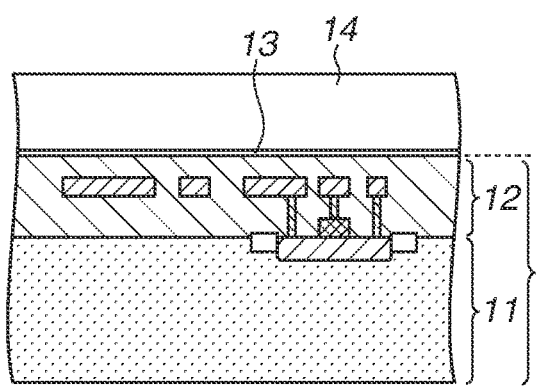
Figure 2D:
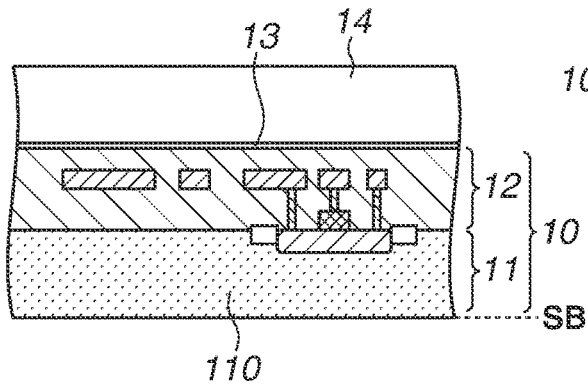

In a step in FIG. 2C, the glass substrate 14 is formed on the upper surface SU of the structure 10 via the adhesive layer 13. While a quartz glass board having a thickness of 0.5 mm is used as the glass substrate 14 in the present exemplary embodiment, a different board having desired strength may be used alternatively. Next, in a step in FIG. 2D, back grinding processing is performed on the back surface of the semiconductor substrate 110, to thin the semiconductor substrate 110. In the present exemplary embodiment, the semiconductor substrate 110 is thinned to a thickness of approximately 0.2 mm. The glass substrate 14 can be formed in any way as long as the semiconductor substrate 110 has sufficient strength in the step in FIG. 2D.

Figure 2E:
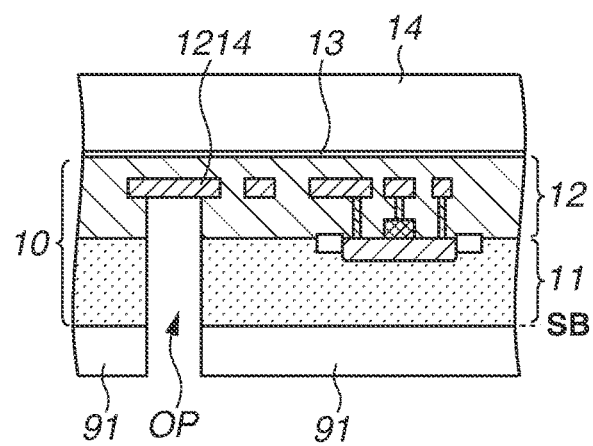

In a step in FIG. 2E, the opening OP is formed in the bottom surface SB of the structure 10. The opening OP is formed in such a manner that the conductive member 1214 in the wiring structure 12 is exposed to the outside. This step is performed by forming a resist pattern 91 on the bottom surface SB and performing etching with the resist pattern 91. This etching is deep reactive ion etching (RIE), which is dry etching using the Bosch process, and the opening OP is formed to extend in a vertical direction (in a direction perpendicular to the bottom surface SB). In the present exemplary embodiment, as this dry etching, capacitively coupled RIE is performed by using a mixed gas of $CF_4$, $C_4F_8$, $O_2$, and Ar.

Figure 2F:
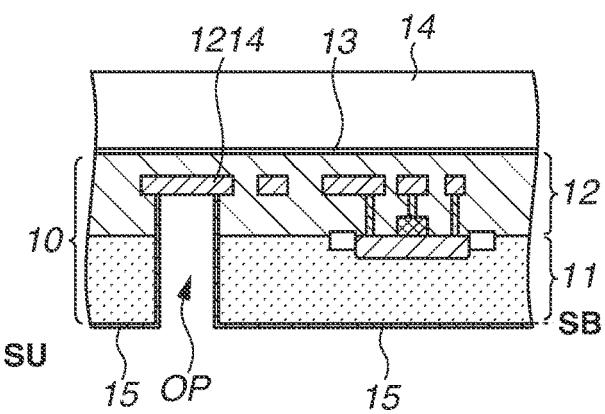

In a step in FIG. 2F, the insulating protective film 15 is formed on the bottom surface SB of the structure 10 and the side surface of the opening OP. This step is performed by forming the protective film 15 by plasma CVD on the bottom surface SB and in the opening OP and by performing dry etching in such a manner that the conductive member 1214 is exposed to the outside. In the present exemplary embodiment, as this dry etching, capacitively coupled RIE is performed by using a mixed gas of $CF_4$, $C_4F_8$, $O_2$, and Ar. While the protective film 15 is a silicon oxide film having a thickness of 1.5 μm in the present exemplary embodiment, a different insulating material such as a silicon nitride film may alternatively be used as another exemplary embodiment.

Figure 2G:
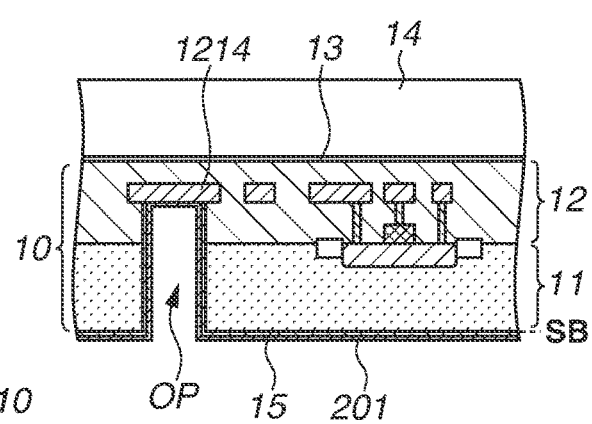
Figure 5A:
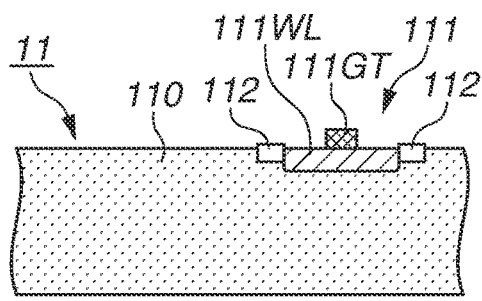
Figure 5B:
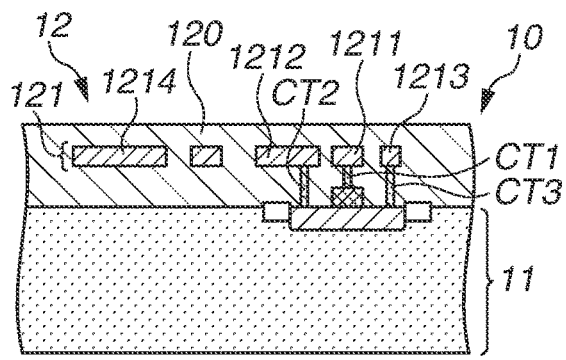
Figure 5C:
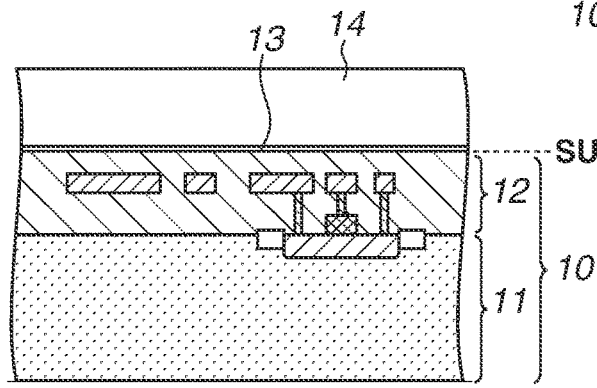
Figure 5D:
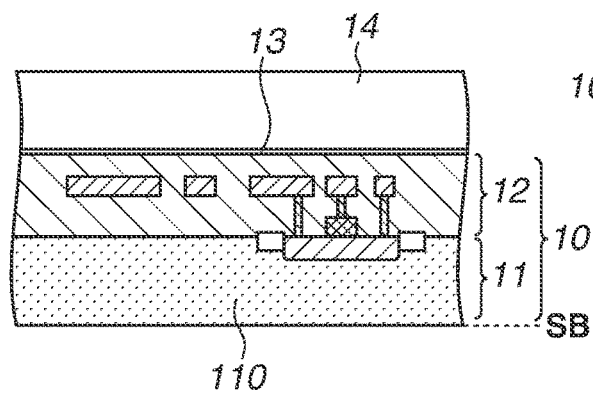
Figure 5E:
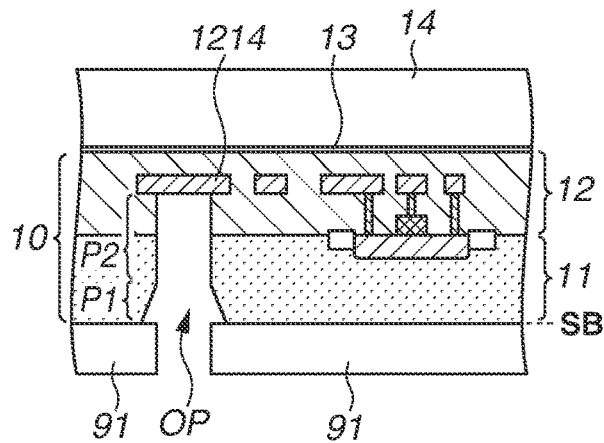
Figure 5F:
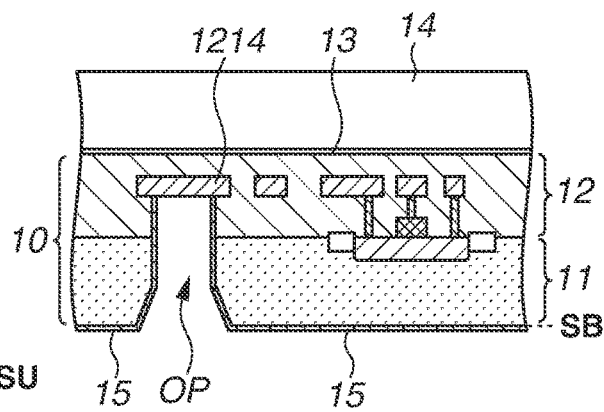
Figure 5G:
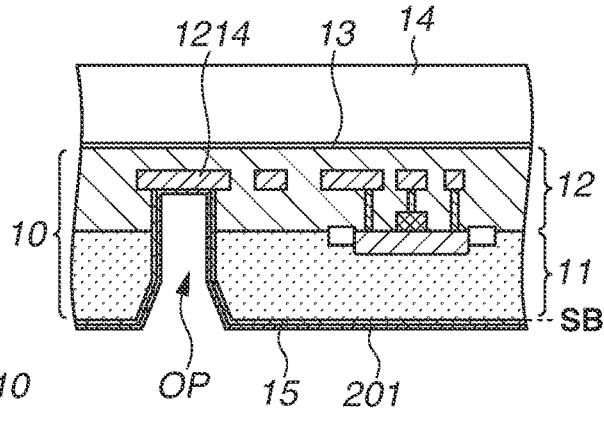

In a step in FIG. 2G, the barrier metal layer 201 is formed to cover the bottom surface SB of the structure 10 and the inner wall of the opening OP. More specifically, the barrier metal layer 201 is formed to cover the bottom surface SB of the structure 10 and the side surface of the opening OP via the protective film 15 and cover the bottom surface of the opening OP (the surface on which the conductive member 1214 is exposed to the outside). The barrier metal layer 201 is in contact with the conductive member 1214 in the opening OP. This step is performed by sputtering, and titanium (Ti) is used for the barrier metal layer 201. In the following description, the term "cover" includes a case where a member directly covers another member and a case where a member indirectly covers another member (more specifically, a member covers another member via still another member). Namely, the term "cover" includes a mode in which at least two members are relatively closely located to each other in a certain region.

In a step in FIG. 3H, the seed metal layer 202 is formed to cover the bottom surface SB of the structure 10 and the inner wall of the opening OP. In the present exemplary embodiment, this step is performed by sputtering, and cupper (Cu) is used for the seed metal layer 202.

In a step in FIG. 3I, a resist pattern 92 (a first member) is formed on the seed metal layer 202 in such a manner that the opening OP and a periphery portion thereof are exposed to the outside. For the convenience of the following description, the portion of the seed metal layer 202 that is not covered by the resist pattern 92 will be referred to as a seed metal layer 202A. In addition, the portion of the seed metal layer 202 that is covered by the resist pattern 92 will be referred to as a seed metal layer 202B. Namely, in a plan view of the bottom surface SB, the seed metal layer 202A is a portion (a first portion) that corresponds to the opening OP and the peripheral portion thereof, and the seed metal layer 202B is a portion (a second portion) that is outside the portion (the first portion).

In a step in FIG. 3J, the plating layer 203 is formed on the seed metal layer 202A. In the present exemplary embodiment, Cu is used for the plating layer 203. This step is performed by wet plating, and the plating layer 203 is formed by electroplating in the present exemplary embodiment. In this electroplating, the plating layer 203 is formed by allowing a current to flow through the seed metal layer 202A in a state in which the structure obtained in the step in FIG. 3I is immersed in a solution. This solution includes metal ions (copper ions ($Cu^{2+}$) in the present exemplary embodiment) that serve as the material of the plating layer 203. In the present exemplary embodiment, the plating layer 203 is formed to cover the side surface and the bottom surface of the opening OP (the surface covering the conductive member 1214) and to leave space inside the opening OP.

There is a difference in the level of the seed metal layer 202A due to the opening OP (the seed metal layer 202A has a concave shape). Thus, in the step in FIG. 3J, this difference could create regions where electrolytic concentration occurs and regions where electrolytic relaxation occurs in the solution. As a result, in the solution, regions where a current flows more easily and regions where the current does not flow easily could be created, and the plating layer 203 could sometimes not be formed in a uniform film thickness. As is clear from FIG. 3J, a portion of the plating layer 203, the portion covering the side surface of the opening OP, is formed to be thinner than the other portions (the portion covering the conductive member 1214 and the portion covering the bottom surface SB of the structure 10). Namely, this portion of the plating layer 203 that extends in a direction perpendicular to the bottom surface SB tends to be formed thinner than the other portions that extend in a direction parallel to the bottom surface SB (i.e., tends to be formed to have a smaller film thickness). The impact caused by this portion of the plating layer 203 will be described below.

The plating layer 203 may be formed by electroless plating. However, in such case, too, the plating layer 203 could have a non-uniform film thickness due to the shape of the surface on which the plating layer 203 is formed (the difference in the level of the seed metal layer 202A due to the opening OP). This also holds true for cases where dry plating is used.

In a step in FIG. 3K, the resist pattern 92 is removed. Next, in a step in FIG. 3L, a film member 204 is formed to cover the plating layer 203 and the seed metal layer 202B. While Ti (the same material as that of the barrier metal layer 201) is used for the film member 204 in the present exemplary embodiment, another conductive material may alternatively be used. This step is performed by deposition such as sputtering.

In a step in FIG. 3M, the film member 204 is etched back by wet etching in such a manner that horizontal surfaces of the plating layer 203 and the seed metal layer 202B (surfaces in parallel to the bottom surface SB) are exposed to the outside. Consequently, protective films 204A and 204B remain on the vertical surfaces of the plating layer 203 inside the opening OP and outside the opening OP, respectively (on the surfaces in a direction perpendicular to the bottom surface SB). Namely, as a result of this step, the protective film 204A is formed to cover the vertical surface of the plating layer 203 inside the opening OP (a second member), and the protective film 204B is formed to cover the vertical surface of the plating layer 203 outside the opening OP.

In a step in FIG. 3N, the seed metal layer 202B and a portion of the barrier metal layer 201, the portion being covered by the seed metal layer 202B, are removed in such a manner that the corresponding protective film 15 is exposed to the outside. This step is performed by wet etching. The portion of the plating layer 203 that extends in a direction in parallel to the bottom surface SB has a relatively large film thickness. Thus, the etching in this step may be performed under the condition that the etching rate used for the seed metal layer 202B is larger than that used for the barrier metal layer 201 and the protective film 204A. In the present exemplary embodiment, since the film member 204 and the barrier metal layer 201 are the same material, when the above portion of the barrier metal layer 201 is removed, the protective film 204B can be removed. However, as another exemplary embodiment, the protective film 204B may be allowed to remain. As still another exemplary embodiment, a material including metal elements having the same atomic number may be used for the film member 204 and the barrier metal layer 201, and the same holds true for this case, too.

In this way, the electrode 20 is formed. Since this electrode 20 is formed to vertically extend through the substrate 11, the electrode 20 can be referred to as a through-silicon via (TSV), for example.

In the step in FIG. 3M, while the portion of the film member 204 (the portion near the conductive member 1214) that covers the bottom surface of the opening OP is removed, this portion may be allowed to remain so as to effectively prevent thinning of the plating layer 203 in the opening OP in the step in FIG. 3N. This portion of the film member 204 can be allowed to remain by etching back the film member 204 in the step in FIG. 3M in a state in which the film member 204 is covered by a resist pattern at the opening OP and the peripheral portion thereof.

In accordance with the procedure as described above, the structure of the electronic component 1 described with reference to FIG. 1 is obtained. The manufacturing method of the electronic component 1 is not limited to the above example. Between steps, one or more necessary steps such as thermal treatment and washing treatment may be performed additionally. Additionally or alternatively, one or more steps may be omitted. The material of any one of the individual members described as examples may be replaced by another material that can realize the corresponding function.

By subsequently performing various steps such as application of solder resist, arrangement of solder balls, and dicing on the above structure, a die is obtained. This die is mounted on a different substrate such as a printed circuit board, and the electrode 20 is electrically connected to the different substrate via the solder balls.

In the step in FIG. 3J, as described above, since there is a difference in the level of the seed metal layer 202A due to the opening OP, the plating layer 203 could sometimes not be formed in a uniform film thickness. The portion of the plating layer 203 that covers the side surface of the opening OP tends to be formed thinner than the other portions (the portion covering the conductive member 1214 and the portion covering the bottom surface SB of the structure 10). In the above example, the portion of the plating layer 203 that extends in a direction perpendicular to the bottom surface SB is thinner than the other portions that extend in a direction in parallel to the bottom surface SB (the portion has a smaller film thickness). Thus, in a subsequent step, e.g., in the step in which in the seed metal layer 202B, etc. are etched in the present exemplary embodiment, the portion of the plating layer 203 having the relatively small thickness could be further thinned or removed. Consequently, the resistance of the electrode 20 could be increased or the electrode 20 could be disconnected, resulting in deterioration in electrical characteristics of the electronic component 1 or deterioration in the yield thereof.

In the present exemplary embodiment, in the step in FIG. 3M, the protective film 204A is formed to cover the plating layer 203. In the present exemplary embodiment, while the protective film 204A covers the portion of the plating layer 203 having the relatively small film thickness, the protective film 204A may be allowed to cover all the surfaces of the plating layer 203. Next, in the step in FIG. 3N, the seed metal layer 202B and the portion of the barrier metal layer 201 covered by the seed metal layer 202B are etched in a state in which the plating layer 203 is covered by the protective film 204A. Thus, the impact caused by the etching on the plating layer 203 can be reduced. Namely, since the portion of the plating layer 203 having the relatively small film thickness is not further thinned or removed, disconnection of the electrode can be prevented. Thus, the present exemplary embodiment is advantageous in improvement in electrical characteristics of the electronic component 1 and improvement in the yield thereof.

In addition, in the present exemplary embodiment, since a conductive material is used for the film member 204, a portion of the film member 204 (the protective film 204A in the present exemplary embodiment) remains inside the opening OP, whereby unexpected short-circuiting of the electrode 20 can be prevented.

In addition, in the present exemplary embodiment, even when the plating layer 203 is formed to leave space inside the opening OP, thinning of the plating layer 203 as a result of the above etching and disconnection of the electrode 20 as a result of the thinning can be prevented. Thus, even when the surface on which the electrode 20 is formed has any shape, the present exemplary embodiment is advantageous in improvement in electrical characteristics of the electronic component 1 and improvement in the yield thereof.

In addition, in the present exemplary embodiment, the protective film 204A covers the portion of the plating layer 203 that covers the side surface of the opening OP. As described above, this portion has a relatively small film thickness. However, according to the present exemplary embodiment, thinning of the plating layer 203 as a result of the above etching and disconnection of the electrode 20 as a result of the thinning can be effectively prevented.

A second exemplary embodiment differs from the first exemplary embodiment mainly in that the opening OP has an inclined side surface. FIG. 4 schematically illustrates a structure of an electronic component 2 according to the present exemplary embodiment. In the present exemplary embodiment, the side surface of the opening OP includes portions P1 and P2. The portion P1 is an inclined surface located at a shallow position (near the bottom surface SB) inside the opening OP, and the portion P2 is a surface, which has a smaller inclined angle than the portion P1 at a deep positon (near the conductive member 1214), inside the opening OP. The inclined angle of a surface is an angle between the surface and a plane in a direction perpendicular to the bottom surface SB. In the present exemplary embodiment, for ease of the description, the portion P2 is illustrated as a vertical surface, and the portion P1 and the portion P2 will hereinafter be referred to as an inclined portion P1 and a vertical portion P2, respectively. In the present exemplary embodiment, the protective film 204A is formed to cover the vertical portion P2. The present exemplary embodiment provides the same advantageous effects as those provided by the first exemplary embodiment.

FIGS. 5A to 6N illustrate a manufacturing method of the electronic component 2. Since steps in FIGS. 5A to 5D are the same as those in the first exemplary embodiment (the steps in FIGS. 2A to 2D), redundant description thereof will be avoided. In a step in FIG. 5E, the opening OP is formed in the bottom surface SB of the structure 10. This step is performed by forming the resist pattern 91 on the bottom surface SB and performing etching twice under different conditions by using the resist pattern 91. Specifically, first, the inclined portion P1 is formed by performing isotropic dry etching. As this isotropic dry etching, in the present exemplary embodiment, inductively coupled RIE is performed under a reactant gas environment such as under $SF_6$, $C_4F_8$, or $O_2$. Next, the vertical portion P2 is formed by performing anisotropic dry etching. Deep RIE is performed as this anisotropic dry etching in the present exemplary embodiment, as in the first exemplary embodiment (the step in FIG. 2E).

Steps in FIGS. 5F to 6I can be performed under the same conditions as those in the first exemplary embodiment (the steps in FIGS. 2F to 3I). In the step in FIG. 5F, the insulating protective film 15 is formed on the bottom surface SB of the structure 10 and the side surface of the opening OP. Next, in the step in FIG. 5G, the barrier metal layer 201 is formed to cover the bottom surface SB of the structure 10 and the inner wall of the opening OP. Next, in the step in FIG. 6H, the seed metal layer 202 is formed to cover the bottom surface SB of the structure 10 and the inner wall of the opening OP. Next, in the step in FIG. 6I, the resist pattern 92 is formed on the seed metal layer 202 in such a manner that the opening OP and the peripheral portion thereof are exposed to the outside. As in the first exemplary embodiment, the seed metal layer 202A of the seed metal layer 202 is the portion that is not covered by the resist pattern 92, and the seed metal layer 202B is the other portion of the seed metal layer 202.

In a step in FIG. 6J, the plating layer 203 is formed on the seed metal layer 202A by electroplating. Since there is a difference in the level of the seed metal layer 202A due to the opening OP, the plating layer 203 could sometimes not be formed in a uniform film thickness. Namely, as described in the first exemplary embodiment, the portion of the plating layer 203 that extends in a direction perpendicular to the bottom surface SB tends to be formed thinner than the other portions (the portion tends to be formed with a smaller film thickness).

Next, in a step in FIG. 6K, the resist pattern 92 is removed. Next, in a step in FIG. 6L, the film member 204 is formed to cover the plating layer 203 and the seed metal layer 202B. Next, in a step in FIG. 6M, the film member 204 is etched back by wet etching in such a manner that the horizontal surface and the inclined surface of the plating layer 203 and the horizontal surface of the seed metal layer 202B are exposed to the outside. Consequently, the protective films 204A and 204B remain on the vertical surfaces of the plating layer 203 inside and outside the opening OP, respectively. The protective film 204A covers the vertical portion P2 inside the opening OP, and the protective film 204B covers the vertical surface of the plating layer 203 outside the opening OP.

A step in FIG. 6N can be performed under the same conditions as those in the first exemplary embodiment (the step in FIG. 3N). In this step, the seed metal layer 202B and the portion of the barrier metal layer 201 that is covered by the seed metal layer 202B are removed in such a manner that the corresponding protective film 15 is exposed. In this way, the electrode 20 is formed.

In the present exemplary embodiment, the side surface of the opening OP has the inclined portion P1 at the shallow position inside the opening OP. Namely, the opening OP has a larger diameter at the entrance thereof. Thus, after the step in FIG. 5F, for example, in the steps in FIGS. 5G, 6H, 6J, and 6L, a metal material can appropriately be embedded into the opening OP. Therefore, in the present exemplary embodiment, since the electrode 20 can be formed more appropriately, the present exemplary embodiment is advantageous in manufacturing the electronic component 2.

In this mode, too, as in the first exemplary embodiment, since there is a difference in the level of the seed metal layer 202A due to the opening OP, the plating layer 203 could be formed in a non-uniform film thickness. Thus, in a subsequent step, e.g., in the step in which in the seed metal layer 202B, etc. are etched in the present exemplary embodiment, the portion of the plating layer 203 that has the relatively small thickness could be further thinned or removed.

However, in the present exemplary embodiment, in the step in FIG. 6M, the protective film 204A is formed to cover the plating layer 203. While the protective film 204A covers the portion of the plating layer 203 that has the relatively small film thickness in the present exemplary embodiment (the portion corresponding to the vertical portion P2), the protective film 204A may be allowed to cover all the surfaces of the plating layer 203. Next, in the step in FIG. 6N, the seed metal layer 202B and the portion of the barrier metal layer 201 covered by the seed metal layer 202B are etched in a state in which the plating layer 203 is covered by the protective film 204A. Thus, the impact caused by the etching on the plating layer 203 can be reduced. Namely, since the portion of the plating layer 203 that has the relatively small film thickness is not further thinned or removed, disconnection of the electrode 20 can be prevented. Thus, the present exemplary embodiment enables appropriate formation of the electrode 20 and is advantageous in improvement in electrical characteristics of the electronic component 2 and improvement in the yield thereof.

While suitable modes have been described as examples, the present disclosure is not limited thereto. The modes may be partially modified without departing from the gist of the present disclosure. While a semiconductor device has been used as an example of the electronic components 1, etc. in the above exemplary embodiments, the exemplary embodiments are applicable to a container (a package) in which a wiring substrate or a semiconductor chip is accommodated. In addition, the individual terms in the present description are used only to describe the present disclosure. Thus, needless to say, the present disclosure is not limited to the exact meanings of these terms. Namely, each of the above terms includes its equivalents.

The technique discussed herein can improve electrical characteristics of electronic components and the yield thereof.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2017-037534, filed Feb. 28, 2017, which is hereby incorporated by reference herein in its entirety.

What is claimed is:

1. An electronic component manufacturing method comprising:
    preparing a structure including a conductive member;
    forming a seed metal layer including first and second portions electrically connected to the conductive member on a surface of the structure;
    forming a plating layer on the first portion of the seed metal layer in a state in which the second portion of the seed metal layer is covered by a first member;
    forming a conductive film on the first portion of the seed metal layer via the plating layer, and on the second portion of the seed metal layer,
    forming a second member on the first portion of the seed metal layer via the plating layer, the second member being a part of the conductive film; and
    etching the second portion of the seed metal layer in a state in which the plating layer is covered by the second member.

2. The electronic component manufacturing method according to claim 1,
    wherein the structure has an opening in which the conductive member is exposed, and
    wherein the first portion of the seed metal layer covers a side surface of the opening and a periphery portion of the opening.

3. The electronic component manufacturing method according to claim 2, wherein the plating layer is formed to cover the side surface and a bottom surface of the opening and to leave space inside the opening.

4. The electronic component manufacturing method according to claim 3, wherein the second member is formed to cover a portion of the plating layer, the portion of the plating layer covering the side surface of the opening,
    in the forming of the plating layer, a surface of the plating layer is covered with the first member, the surface of the plating layer being outside the opening, and
    in the etching the second portion of the seed metal layer, the surface of the plating layer is covered with a third member, the third member being a part of the conductive film.

5. The electronic component manufacturing method according to claim 2, wherein the side surface of the opening includes an inclined portion at a shallow position inside the opening and a portion having a smaller inclined angle than the inclined portion at a deep positon inside the opening.

6. The electronic component manufacturing method according to claim 5, wherein the second member is formed closer to the portion having the smaller inclined angle than to the inclined portion.

7. The electronic component manufacturing method according to claim 2, wherein, before the opening is formed, a board is fixed to a surface of the structure that is opposite to the surface of the structure on which the seed metal layer is formed.

8. The electronic component manufacturing method according to claim 1, wherein the second member is made of a material including titanium.

9. The electronic component manufacturing method according to claim 1, further comprising:
    dicing the structure after etching the second portion of the seed metal layer; and
    electrically connecting the diced structure to a different substrate via an electrode.

10. The electronic component manufacturing method according to claim 1, wherein the conductive film is formed in contact with the seed metal layer.

11. An electronic component manufacturing method comprising:
    preparing a structure including a conductive member;
    forming a seed metal layer including first and second portions electrically connected to the conductive member on a surface of the structure;
    forming a plating layer on the first portion of the seed metal layer in a state in which the second portion of the seed metal layer is covered by a first member;
    forming a second member on the first portion of the seed metal layer via the plating layer, the second member being made of a conductive material; and
    etching the second portion of the seed metal layer in a state in which the plating layer is covered by the second member,
    wherein the structure has an opening in which the conductive member is exposed,
    wherein the first portion of the seed metal layer covers a side surface of the opening and a periphery portion of the opening,
    wherein the plating layer is formed to cover the side surface and a bottom surface of the opening and to leave space inside the opening,
    wherein the second member is formed to cover a portion of the plating layer, the portion of the plating layer covering the side surface of the opening, and
    wherein the forming of the second member includes forming a film including the second member on the plating layer by deposition and removing a portion of the formed film by etch-back processing.

12. An electronic component manufacturing method comprising:
preparing a structure including a conductive member;
forming a seed metal layer including first and second portions electrically connected to the conductive member on a surface of the structure;
forming a plating layer on the first portion of the seed metal layer in a state in which the second portion of the seed metal layer is covered by a first member;
forming a second member on the first portion of the seed metal layer via the plating layer after removing the first member, the second member being made of a conductive material; and
etching the second portion of the seed metal layer in a state in which the plating layer is covered by the second member.

13. The electronic component manufacturing method according to claim 12,
wherein the first member is a resist pattern, and
wherein, when the plating layer formed by electroplating at the first portion of the seed metal layer that is not covered by the resist pattern.

14. The electronic component manufacturing method according to claim 12, further comprising forming a barrier metal layer to come into contact with the conductive member before forming the seed metal layer.

15. The electronic component manufacturing method according to claim 14, wherein the second member and the barrier metal layer include a metal element having the same atomic number.

16. The electronic component manufacturing method according to claim 15, wherein the second portion of the seed metal layer is etched before an area of the barrier metal layer having been covered by the second portion of the seed metal layer.

17. The electronic component manufacturing method according to claim 16, wherein the second portion of the seed metal layer is etched with a larger etching rate for the seed metal layer than for the barrier metal layer and the second member.

18. The electronic component manufacturing method according to claim 12,
wherein the structure includes a substrate on which a plurality of elements is formed and a wiring structure including an insulating layer and a wiring layer formed on the substrate, and
wherein the conductive member is a portion of the wiring layer.

19. The electronic component manufacturing method according to claim 18,
wherein the structure has an opening in which the conductive member is exposed, and the first portion of the seed metal layer covers a side face of the opening and a periphery portion of the opening, and
wherein the opening is formed to extend through the substrate from a bottom surface of the substrate.

20. The electronic component manufacturing method according to claim 12, further comprising:
dicing the structure after etching the second portion of the seed metal layer; and
electrically connecting the diced structure to a different substrate via an electrode.

* * * * *